(12) United States Patent
Nicol

(10) Patent No.: US 6,275,842 B1
(45) Date of Patent: Aug. 14, 2001

(54) LOW POWER MULTIPLIER FOR CPU AND DSP

(75) Inventor: Christopher John Nicol, Red Bank, NJ (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/431,851

(22) Filed: Nov. 2, 1999

Related U.S. Application Data

(62) Division of application No. 09/025,945, filed on Feb. 19, 1998, now Pat. No. 6,065,032.

(51) Int. Cl.$^7$ ................................ G06F 7/52; G06F 7/38
(52) U.S. Cl. .................................... 708/620; 708/490
(58) Field of Search ........................ 708/620, 490

(56) References Cited

U.S. PATENT DOCUMENTS 5,260,898 * 11/1993 Richardson ..................... 708/490
5,262,973 * 11/1993 Richardson ..................... 708/490

FOREIGN PATENT DOCUMENTS 9-101877    4/1997  (JP) .

OTHER PUBLICATIONS

Patent Abstracts of Japan, vol. 097, No. 008, Aug. 29, 1997.

Weste, Neil H.E. and Eshraghian, Kamran, Principles of CMOS VLSI Design: A Systems Perspective, 2$^{nd}$ ed., 1993, Addison–Wesley Publishing Company, pps. 291–292; pps. 304–305 and pps. 547–555.

* cited by examiner

*Primary Examiner*—Tan V. Mai
(74) *Attorney, Agent, or Firm*—Eugene J. Rosenthal

(57) ABSTRACT

The NEG output of the Booth encoding circuit and the multiplicand input are gated so as to minimize switching activity in the multiplier without adding any delay to the critical path thereof. Advantageously, power consumption in the multiplier is significantly reduced, e.g., on the order of 90%, when multiplication is in fact not being performed. Additionally, by changing the structure of the last XOR gate of the partial product generation circuit, the need to gate the multiplicand input can be eliminated. Advantageously, this eliminates the extra circuitry which would otherwise be required to gate the multiplicand input, thus reducing cost. Furthermore, additional power savings may be achieved by efficiently resynchronizing the multiplicand input with the Booth encoded input to the partial product circuit.

2 Claims, 1 Drawing Sheet

LOW POWER MULTIPLIER FOR CPU AND DSP

This is a divisional of application Ser. No. 09/025,945, filed on Feb. 19, 1998 now U.S. Pat. No. 6,065,032.

TECHNICAL FIELD

This invention relates to the processors, and more particularly, to multipliers for use in central processing units and digital signal processors.

BACKGROUND OF THE INVENTION

Hardware-based multipliers are often added to digital signal processors (DSP) and central processing units (CPU) to speed up the multiplication function, and thus speed up application execution. Typically, in DSPs and CPUs, the operands are loaded into respective registers, and are then supplied to the execution unit to have the appropriate operation performed. The execution unit is often made up of one or more function units, each of which has access to the operands stored in the registers, and which performed a particular dedicated function, e.g., add, Boolean arithmetic, or multiplication. The longest time taken by any of the function units represents the critical path of the execution unit, and determines the maximum speed of the execution unit. Since all the function units have access to the operands in parallel, all the function units perform their respective function each cycle of the execution unit. However, only the result from the function unit specified by the instruction currently being executed is supplied as the output of the execution unit. As a result, much work is performed, and power is consumed so doing, although only a small fraction of that consumed power contributes to the production of a beneficial result. In particular, the multiplier function unit, consumes the lion's share of the power, while it is often used only a small percentage of the time.

Known approaches to reducing the power used by the multiplier is to logically gate one or more of its inputs with a control signal that is responsive to the instruction type, where inputs are supplied to the multiplier only when multiplication is actually being performed. The most commonly used type of multiplier makes use of Booth encoding of one of the operands. It is known that gating the Booth encoded input yields the lowest power consumption in the multiplier. In addition, it is also well known that the critical path of the multiplier is along the path through the Booth encoder. As a result, disadvantageously, gating this input would add delay to the multiplier, and hence slow down the speed of the entire execution unit.

SUMMARY OF THE INVENTION

I have recognized that by gating the NEG output of the Booth encoding circuit and the multiplicand input that switching activity in the multiplier is minimized yet no delay is added to the multiplier's critical path. Advantageously, power consumption in the multiplier is significantly reduced, e.g., on the order of 90%, when multiplication is in fact not being performed. Additionally, by changing the structure of the last XOR gate of the partial product generation circuit, the need to gate the multiplicand input can be eliminated. Advantageously, this eliminates the extra circuitry which would otherwise be required to gate the multiplicand input, thus reducing cost. Furthermore, additional power savings may be achieved by efficiently resynchronizing the multiplicand input with the Booth encoded input to the partial product circuit.

DETAILED DESCRIPTION

Figure 1:
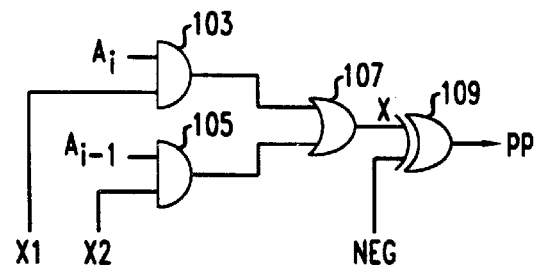
FIG. 1 shows an exemplary prior art basic partial product circuit.

Before describing the gating of the NEG output of the Booth encoding circuit and the multiplicand input to minimize switching activity in the multiplier without adding any delay to the critical path thereof, in accordance with the principles of the invention, it is useful to understand the prior art partial product circuit to which the gating of the invention is applied. Therefore, FIG. 1 shows an exemplary prior art basic partial product circuit 101 which takes a) the outputs X1, X2 and NEG of a Booth encoder (not shown) which is encoding three bits of the multiplier and b) two adjacent bits of multiplicand, $A_i$ and $A_{i-1}$, and computes one bit of a partial product, output PP. Note that a Booth encoder is a special encoder which is used to speed up the multiplication process. Booth encoders, their structure and use in multipliers are described by N. Weste and K. Eshraghian on pages 547–554 of *Principles of CMOS VLSI Design, $2^{nd}$ Ed.*, Addison Wesley, 1992, which is incorporated by reference as if fully set forth herein. Note that Booth encoders are referred to therein as Booth recoders. The partial products generated by each partial product circuit in the multiplier are then further combined to form the overall output of the multiplier, as is well known.

The operation of the partial product circuit, in brief, is as follows. Via AND gate 103 signal X1 selects signal $A_i$ and via AND gate 105 signal X2 selects signal $A_{i-1}$. The outputs of AND gates 103 and 105 are logically ORed by OR gate 107 to generate internal signal X. The NEG output of the Booth encoder is supplied as an input to XOR gate 109, which supplies as its output signal PP. Signal PP takes the value of X when NEG has a value of logic 0 or the compliment of the value of X when NEG has a value of logic 1.

Figure 2:
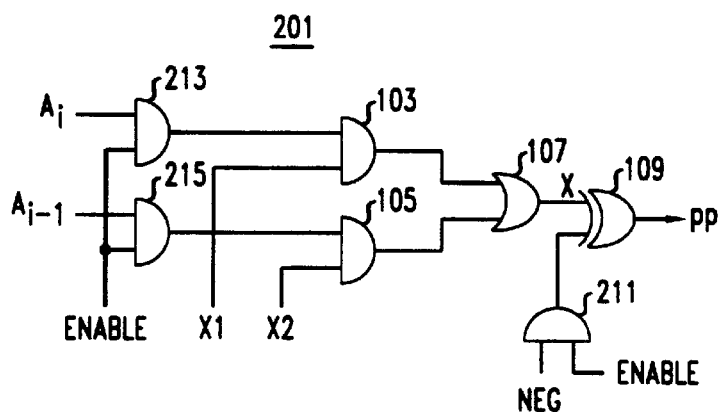
FIG. 2 shows an exemplary partial product circuit arranged in accordance with the principles of the invention.

We have recognized that because the critical path of this partial product circuit passes through AND gates 103 and 105, as well as OR gate 107, prior to arriving at XOR gate 109, the value of signal NEG may be supplied somewhat later than the values of X1 and X2 without impacting on the promptness of the determination of PP at XOR gate 109. Therefore, in the exemplary partial product circuit of FIG. 2, which is arranged in accordance with the principles of the invention, the NEG signal is gated with signal ENABLE using AND gate 211 prior to supplying the gated result, which is the value of the NEG signal when signal ENABLE is a logic 1 and a logic 0 otherwise, to XOR gate 109. Thus, when signal ENABLE is a logic 0, the value of signal NEG is ignored, and in fact is always a logic 0. However, the value signal of signal X may still change, resulting in transitions at output PP.

We have also recognized that, to avoid delay in the operation of the partial product circuit, inputs $A_i$ and $A_{i-1}$ are must be available at least by the time that values X1 and X2 are available. Since $A_i$ and $A_{i-1}$ are typically not encoded and are available at the same time that the multiplier input is supplied to the Booth encoder, they may be gated by logic circuits that operate at least as fast as the portion of the Booth encoder that generates X1 and X2 prior to being supplied to AND gates 103 and 105, without causing a delay in the determination of PP. Such a gating is shown being performed in FIG. 2 by AND gates 213 and 215. Note that AND gates 213 and 215 operate faster than the portion of the Booth encoder that generates X1 and X2. When signal ENABLE is a logic 1, signals $A_i$ and $A_{i-1}$ arrive unchanged at gates 103 and 105, with a delay that does not reduce the operation speed of partial product circuit 201. However, when signal ENABLE is a logic 0, the values of $A_i$ and $A_{i-1}$ are masked, and instead of their values logic 0s are supplied to AND gates 103 and 105. As a result, the value of X is a logic 0. regardless of the values of X1 and X2. Thus, as both inputs to XOR gate 109 are logic 0s, the output PP is also a logic 0.

Note that if only $A_i$ and $A_{i-1}$ were masked, the value of NEG could result in power consuming transitions at output PP. Likewise, if only the value of NEG were masked. changes in the values of $A_1$, $A_{i-1}$, X1, and X2 could result in power consuming transitions at output PP.

Note that the principles of the invention may be applied with different numerical representations of the numbers being multiplied or when different gate families are used to implement the partial product circuit.

Additionally, the need for enabling gates for signals $A_i$ and $A_{i-1}$ may be eliminated, in accordance with an aspect of the invention, by changing the structure of the XOR gate 109. More specifically, a so-called transmission gate XOR is employed in lieu of a conventional XOR gate for XOR gate 109. Similarly, if the numerical representations of the numbers being multiplied or when different gate families are used to implement the partial product circuit are employed, a transmission gate XNOR may be employed to the same end.

Note that transmission gates are described by N. Weste and K. Eshraghian on pages 304–305 of *Principles of CMOS VLSI Design, 2nd Ed.*, Addison Wesley, 1992, which is incorporated by reference as if fully set forth herein. Also, transmission gates may be combined to form a multiplexor, as described by N. Weste and K. Eshraghian on pages 291–294 of *Principles of CMOS VLSI Design, 2nd Ed.*, Addison Wesley, 1992, which is incorporated by reference as if fully set forth herein.

Figure 3:
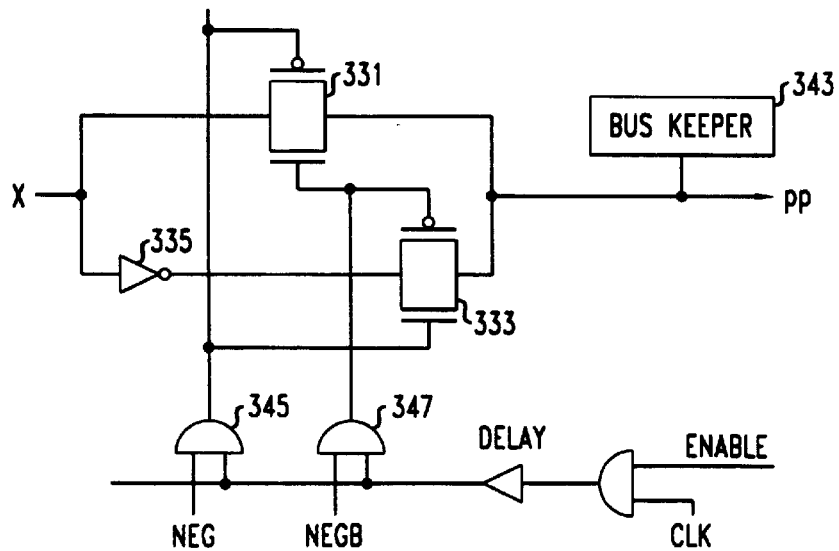
FIG. 3 shows an implementation of the invention using transmission gates.

FIG. 3 shows an implementation of the invention using transmission gates that does not require gating of signals $A_i$ and $A_{i-1}$. Shown in FIG. 3 is only the portion of the partial product circuit after the generation of signal X. Transmission gates 331 and 333 form a two input multiplexer the output of which is controlled by signal NEG and its complement NEGB when signal ENABLE is a logic 1. By supplying signal X to one input of the multiplexer and employing inverter 335 to supply the inverse of signal X to the other input of the multiplexer, the combination of the multiplexer and inverter acts as an XOR gate. This is true so long as the control signals to transmission gates 331 and 333 are complementary, i.e., when signal ENABLE is a logic 1, so that transmission gate 331 is supplied with signal NEG while transmission gate 333 is supplied with signal NEGB. However, when signal ENABLE is a logic 0, both control signals to the multiplexer formed by transmission gates 331 and 333 are brought to logic 0 by the action of AND gates 345 and 347. This causes both of transmission gates 331 and 333 to be off, resulting in the output PP essentially being tri-stated.

It is necessary to supply some stable value at point PP in order to keep power from being consumed. In one embodiment of the invention, the value of PP may be asserted to either a logic 1 or a logic 0. However, doing so may result in unnecessary power consuming transitions. For example, if the value of PP was a logic 0 prior to signal ENABLE being brought to a logic 0, and the value of PP is asserted to a logic 1, a transition from logic zero to logic 1 will occur. This may be avoided, in accordance with a further aspect of the invention, by employing bus keeper circuit 343 to maintain the value at PP at whatever value was there prior to signal ENABLE signal becoming a logic 0.

Furthermore, additional power savings may be achieved by resynchronizing the multiplicand input with the Booth encoded input to the partial product circuit. To this end, signal ENABLE when it is a logic 0 and it is returning to a logic 1 is delayed from being supplied as a logic 1 to AND gates 345 and 347 until signal X reaches a stable value. Doing so insures that spurious transitions caused by the computation of X cannot pass to output PP. Note that this technique is especially useful with multipliers which employ a Wallace adder tree.

The foregoing merely illustrates the principles of the inventions. It will thus be appreciated that those skilled in the art will be able to devise various arrangements which, although not explicitly described or shown herein, embody the principles of the invention and are included within its spirit and scope.

What is claimed is:

1. A multiplier for multiplying two operands to produce an output, said multiplier including circuitry for disabling a changing of state of said output in response to a control signal, said circuitry for disabling being characterized in that it does not lengthen a critical path of said multiplier.

2. A processor comprising:

operand storage; and a multiplier for multiplying two operands, said multiplier including circuitry for disabling a changing of state of a multiplier output in response to a control signal, said circuitry for disabling being characterized in that it is located outside of a critical path of said multiplier, whereby operational speed of said multiplier is not reduced by said circuitry for disabling.

* * * * *